US011877429B2

United States Patent
Ha et al.

(10) Patent No.: US 11,877,429 B2
(45) Date of Patent: Jan. 16, 2024

(54) POWER CONVERTER APPARATUS FOR VEHICLE

(71) Applicants: Hyundai Motor Company, Seoul (KR); Kia Corporation, Seoul (KR)

(72) Inventors: Ok Geun Ha, Hwaseong-si (KR); Sung Jun Yoon, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 70 days.

(21) Appl. No.: 17/831,533

(22) Filed: Jun. 3, 2022

(65) Prior Publication Data
US 2023/0029206 A1  Jan. 26, 2023

(30) Foreign Application Priority Data

Jul. 26, 2021  (KR) .......................... 10-2021-0097979

(51) Int. Cl.
| | |
|---|---|
| H05K 7/20 | (2006.01) |
| B60L 53/20 | (2019.01) |
| H01L 23/473 | (2006.01) |
| H01G 2/08 | (2006.01) |
| H05K 7/14 | (2006.01) |

(52) U.S. Cl.
CPC .......... *H05K 7/20927* (2013.01); *B60L 53/20* (2019.02); *H01L 23/473* (2013.01); *H05K 7/20872* (2013.01); *H01G 2/08* (2013.01); *H05K 7/1432* (2013.01)

(58) Field of Classification Search
CPC .......... H05K 7/20927; H05K 7/20254; H05K 7/20272; H01L 23/473; H01G 2/08; B60K 11/02
See application file for complete search history.

(56) References Cited

U.S. PATENT DOCUMENTS 7,692,923 B2 *  4/2010  Nakamura ......... H05K 7/20927
                                                    361/689
8,811,016 B2 *  8/2014  You ..................... H05K 7/20927
                                                    361/689
(Continued)

FOREIGN PATENT DOCUMENTS

| KR | 10-0998810 B1 | 12/2010 |
|---|---|---|
| KR | 10-2019-0105913 A | 9/2019 |
| KR | 10-2022-0059146 A | 5/2022 |

*Primary Examiner* — Zachary Pape
(74) *Attorney, Agent, or Firm* — Morgan, Lewis & Bockius LLP

(57) ABSTRACT

A power converter apparatus for a vehicle includes: a cooling block provided with a refrigerant inlet and a refrigerant outlet, and with two cooling baths connected to the refrigerant inlet in parallel and each having a shape open to an outside, the cooling block being configured to allow refrigerants passing through the two cooling baths to be merged prior to being discharged through the refrigerant outlet; two cooling plates, wherein each of the two cooling plates covers an opening of an associated one of the cooling baths to provide a cooling chamber and includes a plurality of cooling fins protruding into the cooling chamber; and two cooling tubes, wherein each of the cooling tubes is coupled to the cooling block to provide a space for accommodating a power module between the cooling tube and an associated one of the cooling plates.

11 Claims, 9 Drawing Sheets

(56) References Cited

U.S. PATENT DOCUMENTS

| | | | |
|---|---|---|---|
| 9,578,788 B2* | 2/2017 | Tang | H05K 7/20927 |
| 2008/0117602 A1* | 5/2008 | Korich | H01G 11/82 |
| | | | 361/715 |
| 2009/0021971 A1* | 1/2009 | Korich | H05K 7/20927 |
| | | | 363/141 |
| 2022/0346286 A1* | 10/2022 | Kim | H05K 7/20927 |

* cited by examiner

POWER CONVERTER APPARATUS FOR VEHICLE

CROSS REFERENCE TO RELATED APPLICATION

The present application claims priority to Korean Patent Application No. 10-2021-0097979, filed Jul. 26, 2021, the entire contents of which is incorporated herein for all purposes by this reference.

TECHNICAL FIELD

The present disclosure relates to a power converter apparatus for a vehicle in which a power module, a capacitor, an LDC, and the like implementing an inverter used in an eco-friendly vehicle are implemented in one assembly form.

BACKGROUND

An eco-friendly vehicle is a vehicle that generates power by driving a motor, which is an electric rotating mechanism, using electric energy stored in a battery.

The eco-friendly vehicle as described above includes an inverter having a switching element to convert DC power of the battery into AC power having a plurality of phases required for driving the motor, a low voltage DC-DC converter (LDC) that converts high voltage power stored in the battery for driving the motor to low voltage power for electric power load, and the like.

The inverter is provided with a high-capacity capacitor that filters power input from the battery. In addition, a switching element of the inverter is implemented in a form of a power module packaged with an Insulated Gate Bipolar Transistor (IGBT) or Field Effective Transistor (FET) and a diode.

The capacitor, power module, LDC, and the like which are components constituting the inverter as described above may be provided in a vehicle as respective devices having separated structures but may be integrated in a form of an assembly in order to secure space for arrangement of other parts in the vehicle and for efficient cooling of each part.

In the present art, there is a demand for a power converter apparatus for a vehicle having a new structure in which components for power conversion required for a vehicle, such as capacitors, power modules, LDCs, and the like may be integrated into one assembly form, and which may maximize the performance of each component through efficient cooling with respect to each individual component.

The matters described as above are only for improving the understanding of the background of the present disclosure and should not be taken as acknowledging that the matters correspond to the related art already known to those of ordinary skill in the art.

SUMMARY OF THE DISCLOSURE

Accordingly, the present disclosure has been made keeping in mind the above problems occurring in the related art, and an objective of the present disclosure is to provide a power converter apparatus for a vehicle that may integrate parts for power conversion required for an eco-friendly vehicle, such as a capacitor, a power module, an LDC, and the like, into one assembly form and is capable of performing effective cooling with respect to each of the integrated parts.

In order to achieve the above objective, according to one aspect of the present disclosure, there may be provided a power converter apparatus for a vehicle, the power converter apparatus including: a cooling block provided with a refrigerant inlet and a refrigerant outlet, and with two cooling baths connected to the refrigerant inlet in parallel and each having a shape open to an outside, the cooling block being configured to allow refrigerants passing through the two cooling baths to be merged prior to being discharged through the refrigerant outlet; two cooling plates, wherein each of the two cooling plates covers an opening of an associated one of the cooling baths to provide a cooling chamber and includes a plurality of cooling fins protruding into the cooling chamber; and two cooling tubes, wherein each of the two cooling tubes is coupled to the cooling block to provide a space for accommodating a power module between the cooling tube and an associated one of the cooling plates, each of the two cooling tubes being configured to receive the refrigerant from the refrigerant inlet of the cooling block, thereby delivering the refrigerant to the cooling chamber.

The cooling block may include: a first side surface provided with the refrigerant inlet and the refrigerant outlet; a second side surface and a third side surface respectively connected to opposite ends of the first side surface and respectively provided with the cooling baths; a fourth side surface having opposite ends respectively connected to the second side surface and the third side surface; and a top surface and a bottom surface respectively disposed on a top side and a bottom side of the cooling block to be perpendicular to the first side surface, the second side surface, the third side surface, and the fourth side surface.

Each of the two cooling tubes may be connected to the refrigerant inlet at a side close to the first side surface and communicated with the cooling chamber at a side close to the fourth side surface; and the cooling chamber may be configured such that the refrigerant is to be discharged at a side close to the first side surface, whereby cooling surfaces are formed on opposite sides of the power module between the cooling tube and the cooling plate by the refrigerants flowing in opposite directions to each other.

The refrigerant flow path of the cooling block may include: a branch flow path part at which the refrigerant flowing into the refrigerant inlet is branched off toward the two cooling tubes; a merging part at which the refrigerants discharged from the cooling chambers of the two cooling plates are merged; two connection flow path parts connecting the cooling chambers and the merging part to each other; and a discharge flow path part connected from the merging part to the refrigerant outlet.

Each of the cooling chambers may be configured such that the refrigerant is discharged at a side close to the first side surface; the merging part may be provided at a side close to the fourth side; and the two connection flow path parts may be connected to the cooling chambers, respectively, at sides close to the first side surface with the discharge flow path part interposed therebetween on a same plane and to be connected to the merging part at the side close to the fourth side.

A mounting bath opened to the outside may be disposed on the bottom surface of the cooling block.

A capacitor and a high voltage DC-DC converter (HDC) may be disposed in the mounting bath.

The two connection flow path parts may be provided with respective expansion flow path parts configured to expand a heat exchange area with the fourth side surface at two portions adjacent to the fourth side surface.

A low voltage DC-DC converter (LDC) may be disposed on the fourth side surface.

An LDC may be disposed on the fourth side of the cooling block; and a capacitor and an HDC may be disposed on the bottom surface of the cooling block.

The two connection flow path parts, the merging part, and the discharge flow path part may be exposed on an upper side of the cooling block, and a cover plate configured to seal a side above the two connection flow path parts, the merging part, and the discharge flow path part may be mounted on the cooling block, so that the refrigerant flow path may be formed.

As described above, the present disclosure enables the components such as a capacitor, a power module, an LDC, an HDC, and the like for power conversion required for an eco-friendly vehicle, to be compactly integrated into one assembly form, thereby ensuring excellent vehicle mountability and enabling uniform and effective cooling of each of integrated components to be possible.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE DISCLOSURE

Figure 1:
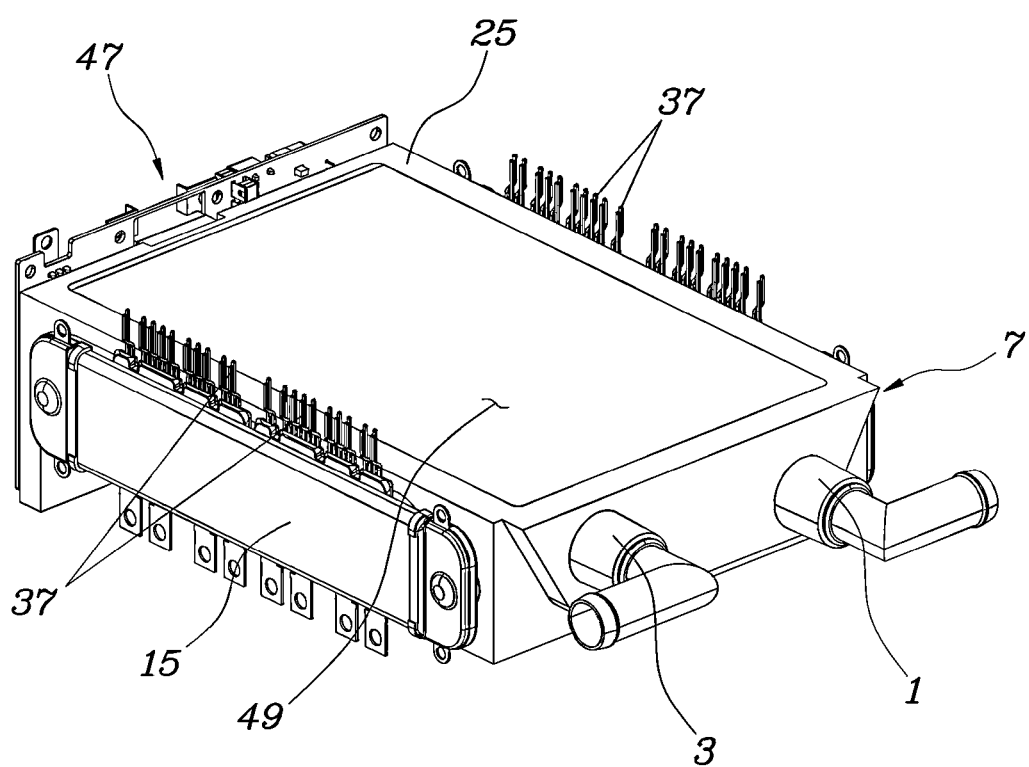
FIG. 1 is a view showing a power converter apparatus for a vehicle according to the present disclosure.

Specific structural or functional descriptions for the embodiments of the present disclosure disclosed in the present specification or application are merely exemplified for the purpose of describing the embodiments according to the present disclosure, and the embodiments according to the present disclosure may be implemented in various forms and should not be construed as being limited to the embodiments described in the present specification or application.

Since the embodiment according to the present disclosure may be subjected to have various changes added thereto and may have various forms, specific embodiments will be illustrated in the drawings and described in detail in the present specification or application. However, this is not intended to limit the embodiment according to the concept of the present disclosure to a specific disclosed form and should be understood to include all changes, equivalents, or substitutes included in the spirit and scope of the present disclosure.

Terms such as first, second, and/or the like may be used to describe various components, but the components should not be limited to the above terms. The above terms are used only for the purpose of distinguishing one component from other components, for example, within the scope not departing from the scope of the rights according to the concept of the present disclosure, the first component may be referred to as the second component, and similarly, the second component may also be referred to as the first component.

When a component is referred to as being "coupled" or "connected" to another component, it should be understood that the component may be directly coupled or connected to another component, but other components may exist in between. On the other hand, when a component is referred to as being "directly connected" or "in direct contact with" another component, it should be understood that no other component is present in between. Other expressions for describing the relationship between elements, that is, expressions such as "between" and "immediately between", "adjacent to" and "directly adjacent to", or the like should be interpreted similarly.

The terms used herein are used only to describe specific embodiments, and are not intended to limit the present disclosure. The singular expression includes the plural expression unless the context clearly dictates otherwise. In the present specification, terms such as "comprise" or "have" are intended to designate that the described feature, number, step, operation, component, part, or combination thereof exists and should be understood such that the existence or addition of one or more other features, numbers, steps, operations, components, parts, or combinations thereof is not precluded in advance.

Unless defined otherwise, all terms used herein, including technical and scientific terms, have the same meaning as commonly understood by one of ordinary skill in the art to which this disclosure belongs. Terms such as those defined in commonly used dictionaries should be interpreted as meanings consistent with the context of the related art and, unless explicitly defined in the present specification, should not be interpreted in an ideal or excessively formal meaning.

Hereinbelow, exemplary embodiments of the present disclosure will be described in detail with reference to the accompanying drawings. The same reference numerals provided on each of the drawings will refer to the same or like members.

With reference to FIGS. 1 to 9, a power converter apparatus for a vehicle of the present disclosure includes: a cooling block 7 provided with a refrigerant inlet 1 and a refrigerant outlet 3, and with two cooling baths 5 connected to the refrigerant inlet 1 in parallel and each having a shape open to an outside, the cooling block 7 being configured to allow refrigerant passing through the two cooling baths 5 to be merged prior to being discharged through the refrigerant outlet 3; two cooling plates 13, wherein each of the two cooling plates forms a cooling chamber 9 by blocking an opening of an associated one of the cooling bath 5 and provided with a plurality of cooling fins 11 protruding into the cooling chamber 9; and two cooling tubes 15. Each of the two cooling tubes is coupled to the cooling block 7 so that a space for mounting a power module is formed between the cooling tube and an associated one of the cooling plates, each of the two cooling tubes being configured to receive the refrigerant from the refrigerant inlet of the cooling block 7, thereby delivering the refrigerant to the cooling chamber 9.

That is, the present disclosure may allow the refrigerant supplied to the refrigerant inlet 1 to flow through the cooling block 7 to form a plurality of cooling surfaces capable of cooling a plurality of power conversion components, and then to be discharged through the refrigerant outlet 3.

In the present embodiment, the cooling block 7 includes: a first side surface 17 provided with the refrigerant inlet 1 and the refrigerant outlet 3; a second side surface 19 and a third side surface 21 respectively connected to opposite ends of the first side surface 17 and respectively provided with the cooling baths 5; a fourth side surface 23 having opposite ends respectively connected to the second side surface 19 and the third side surface 21; and a top surface 25 and a bottom surface 27 respectively formed on a top side and a bottom side of the cooling block to be perpendicular to the first side surface 17, the second side surface 19, the third side surface 21, and the fourth side surface 23.

That is, the cooling block 7 has a shape of a hexahedron as shown but is not necessarily limited to the hexahedron.

A refrigerant flow path 51 of the cooling block 7 includes: a branch flow path part 29 at which the refrigerant flowing into the refrigerant inlet 1 is branched off toward the two cooling tubes 15; a merging part 31 at which the refrigerants discharged from the cooling chambers 9 of the two cooling plates are merged; two connection flow path parts 33 connecting the cooling chamber 9 and the merging part 31 to each other; and a discharge flow path part 35 connected from the merging part 31 to the refrigerant outlet 3.

Of course, the cooling tube 15 is installed between the branch flow path part 29 and the cooling chamber 9 so that the refrigerant supplied from the coolant inlet 1 through the branch flow path part 29 is allowed to be supplied to the cooling chamber 9 through the tube 15.

Each of the two cooling tubes 15 is connected to the refrigerant inlet 1 at a side close to the first side surface 17 and communicated with the cooling chamber 9 at a side close to the fourth side surface, and the cooling chamber 9 is configured such that the refrigerant is to be discharged at a side close to the first side surface 17, whereby cooling surfaces are formed on opposite sides of an object to be cooled that is positioned between the cooling tube 15 and the cooling plate 13 by the refrigerants flowing in opposite directions to each other.

Accordingly, the object to be cooled between the cooling tube 15 and the cooling plate 13 has the cooling surfaces, which the refrigerant flows therethrough, formed on opposite sides, so that very excellent cooling performance may be ensured. Therefore, among a plurality of the components for power conversion as in the present embodiment, the object to be cooled between the cooling tube 15 and the cooling plate 13 may be the power module 37 having the largest thermal load.

As described above, the cooling tube 15 and the cooling chamber 9 that are configured to cool the power module 37 from the opposite sides are configured to receive the refrigerant branched off through the branch flow path part 29 and to cool the power module 37. The refrigerant is delivered from one side of the refrigerants delivered in parallel from two sides of the cooling block 7. Therefore, by enabling the cooling of the power modules 37 dividedly disposed at the opposite sides to be uniform, performance limitation or deterioration of durability of the power modules 37 due to non-uniform cooling may be prevented.

For reference, the cooling plate 13 may be manufactured in a shape in which a plurality of cooling fins 11 protrudes from one side of the flat plate using a thermally conductive material such as aluminum and the like, through a forging process and the like, and the cooling tube 15 may be manufactured such that at least one flow path is formed through which a refrigerant flows therein by extruding a thermally conductive material such as aluminum and the like.

In the present embodiment, each of the cooling chambers 9 is configured such that the refrigerant is discharged at a side close to the first side surface 17; the merging part 31 is provided at a side close to the fourth side surface 23; and the two connection flow path parts 33 are formed to be connected to the cooling chambers 9, respectively, at sides close to the first side surface 17 with the discharge flow path part 35 interposed therebetween on a same plane and to be connected to the merging part 31 at the side close to the fourth side surface 23.

That is, the refrigerants of the two cooling chambers 9 are each configured to be merged at the merging part 31 through the connection flow path parts 33 and to move to the refrigerant outlet 3 through the discharge flow path part 35, and the two flow path parts 33 are formed in a shape extending from the first side 17 to the fourth side surface 23 with the discharge flow path part 35 interposed therebetween on the same plane, so that the top surface 25 and the bottom surface 27 of the cooling block 7 are each to be configured as cooling surfaces providing cooling performance.

Figure 6:
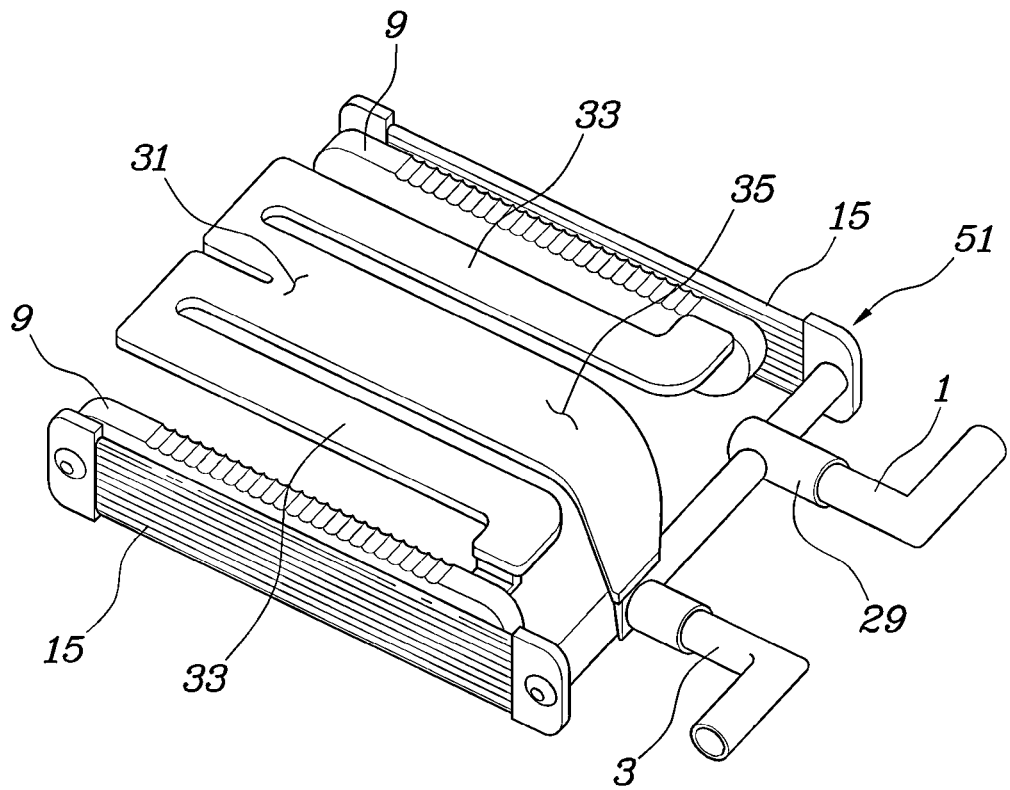
FIG. 6 is a view showing a refrigerant flow path formed in the cooling block of FIG. 4.
Figure 7:
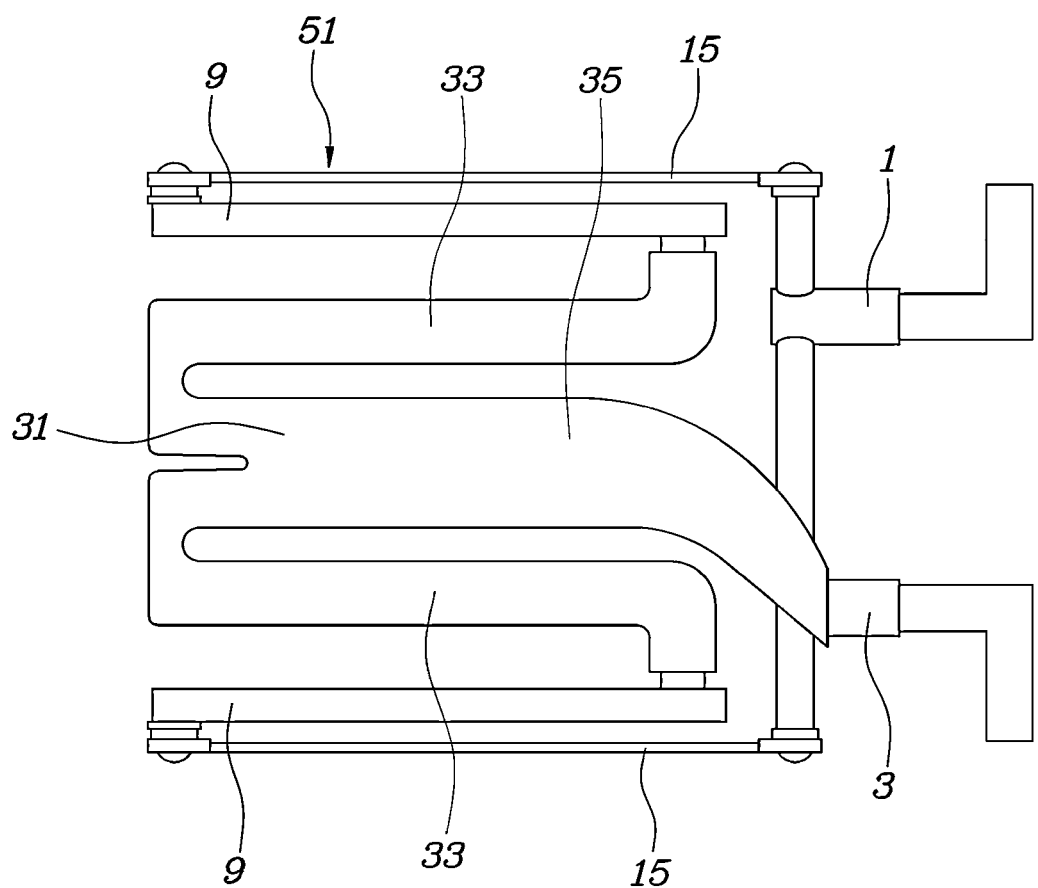
FIG. 7 is a view of the refrigerant flow path of FIG. 6 observed from a top side.
Figure 8:
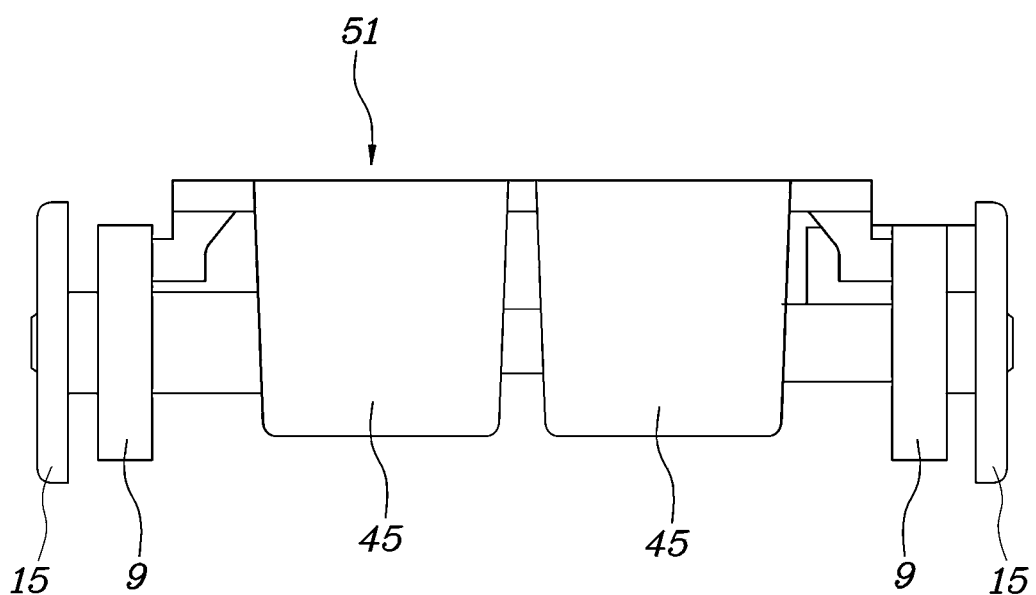
FIG. 8 is a view of the refrigerant flow path of FIG. 6 observed from a left side.
Figure 9:
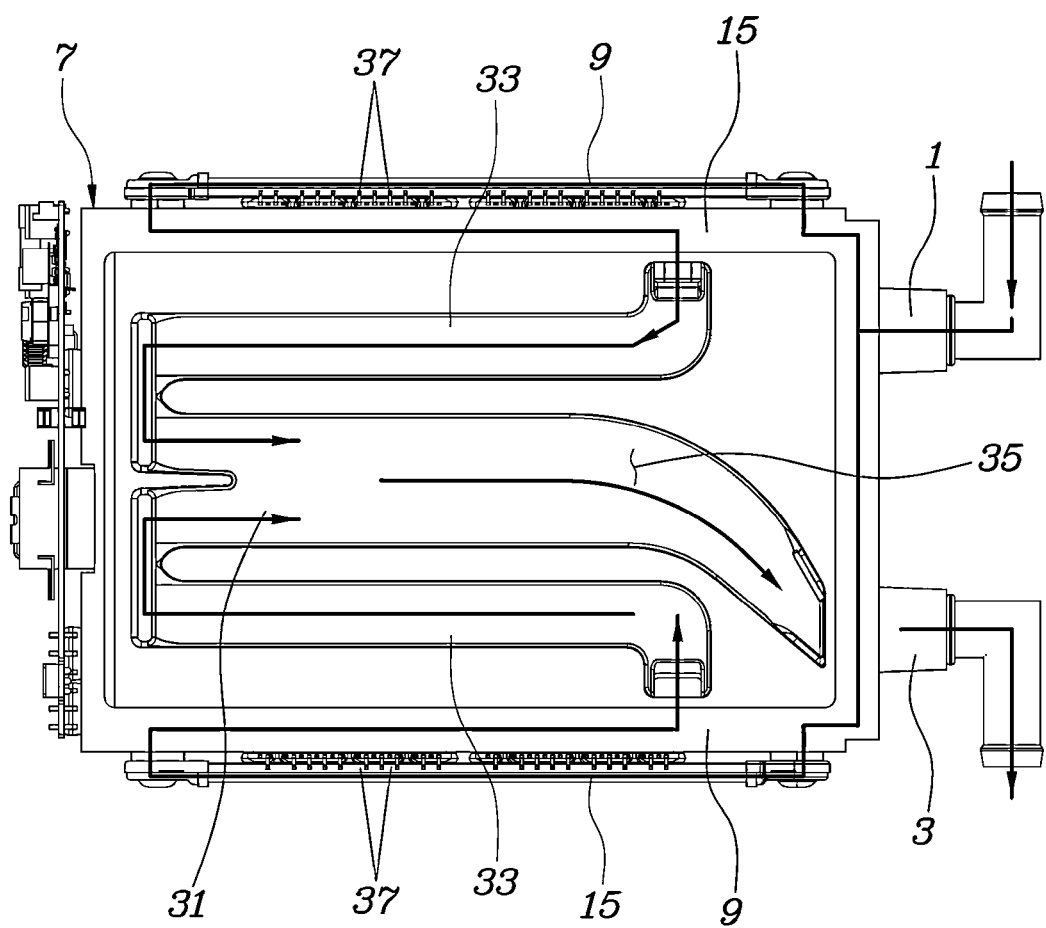
FIG. 9 is a view showing the refrigerant flow path of FIG. 7 expressed on a cooling block.

Of course, to maximize the heat exchange area with the upper surface 25 and the lower surface 27 of the cooling block 7, the connection flow path parts 33 and the discharge flow path part 35 may be each formed in shapes of a thin plate facing the top surface 25 or the bottom surface 27 as shown in FIGS. 6 and 7.

Figure 5:
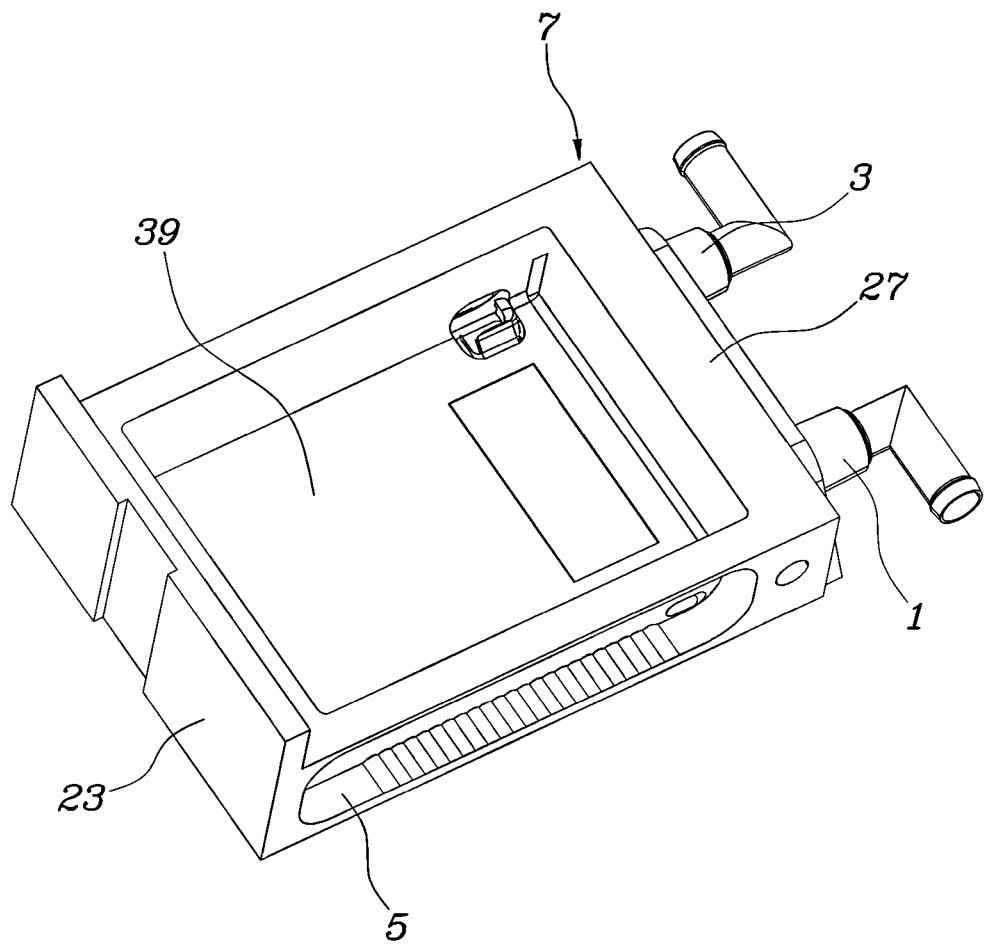
FIG. 5 is a view showing an opposite side of the cooling block of FIG. 4.

In the present embodiment, on the bottom surface 27 of the cooling block 7, as illustrated in FIG. 5, a mounting bath 39 opened to the outside is formed in order to mount the objects to be cooled.

Accordingly, the connection flow path parts 33 and the discharge flow path part 35 effectively cool the objects to be cooled mounted in the mounting bath 39 while passing through the bottom surface of the mounting bath 39.

Figure 2:
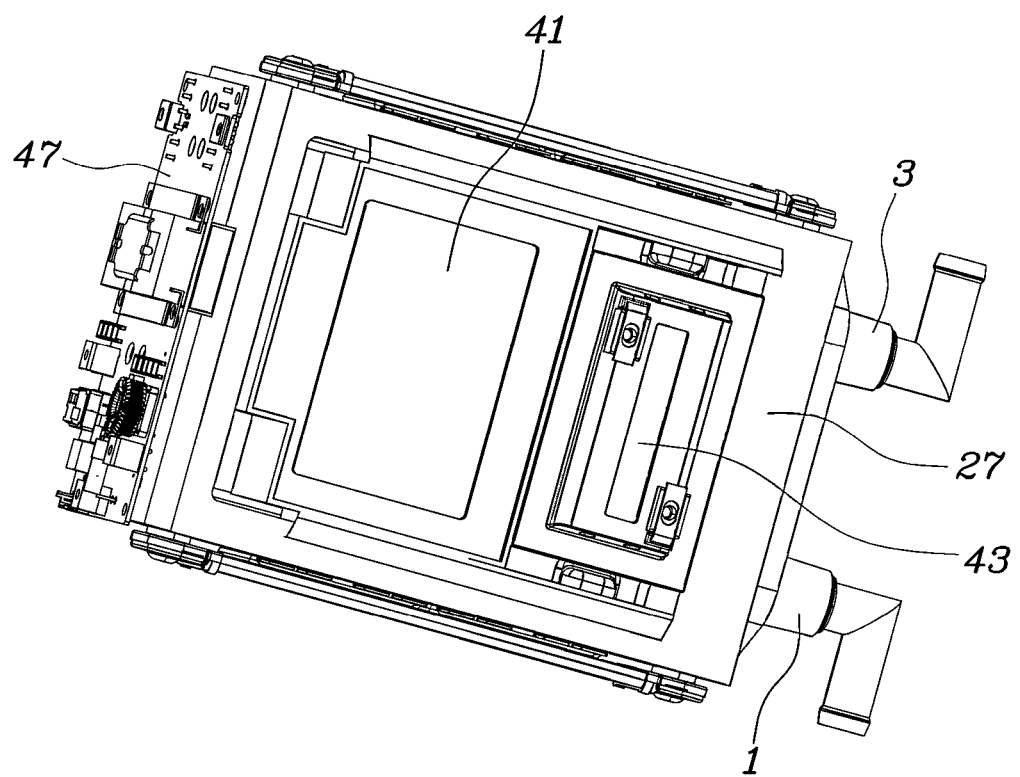
FIG. 2 is a view showing an opposite side of the power converter apparatus for a vehicle of FIG. 1.
Figure 3:
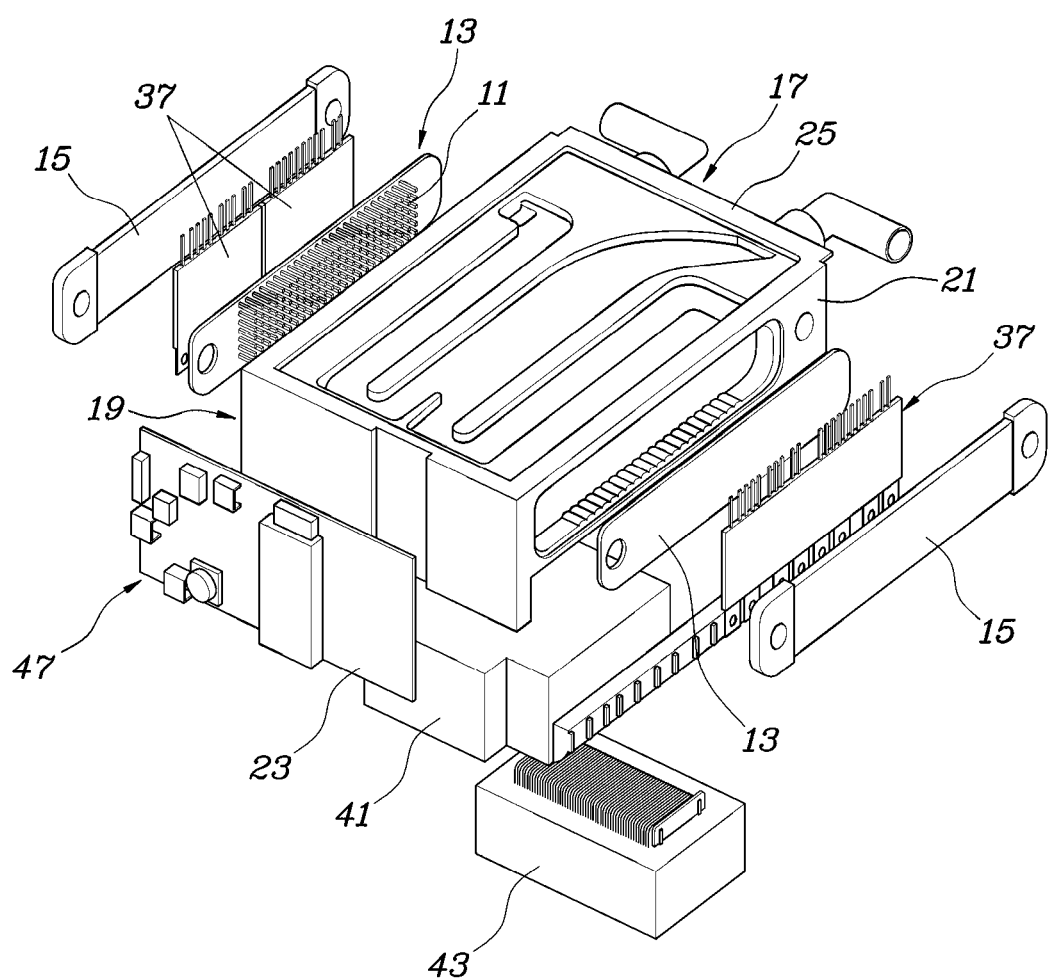
FIG. 3 is an exploded perspective view of the power converter apparatus for a vehicle of FIG. 1.

In the present embodiment, the objects to be cooled mounted in the mounting bath 39 may be a capacitor 41 and a high voltage DC-DC converter (HDC) 43 as shown in FIG. 2.

On the other hand, in the present embodiment, the connection flow path parts 33 are provided with respective expansion flow path parts 45 configured to expand a heat exchange area with the fourth side surface 23 at two portions adjacent to the fourth side surface 23.

Therefore, the fourth side surface 23 may function as a cooling surface, so a low voltage DC-DC converter (LDC) 47 may be mounted thereon as the object to be cooled on the fourth side surface 23.

That is, each of the two power modules 37 is mounted as the object to be cooled between the cooling plate 13 and the cooling tube 15 on one side of a second side surface 19 side and a third side surface 21 side of the cooling block 7, the LDC 47 is directly mounted as the object to be cooled on the fourth side surface 23 of the cooling block 7, and the capacitor 41 and the HDC 43 are mounted as the objects to be cooled on the bottom surface 27 of the cooling block 7. Accordingly, the components for power conversion as described above are integrated in the cooling block 7 while being provided with cooling performance, so that effective cooling is possible while having a compact configuration.

Figure 4:
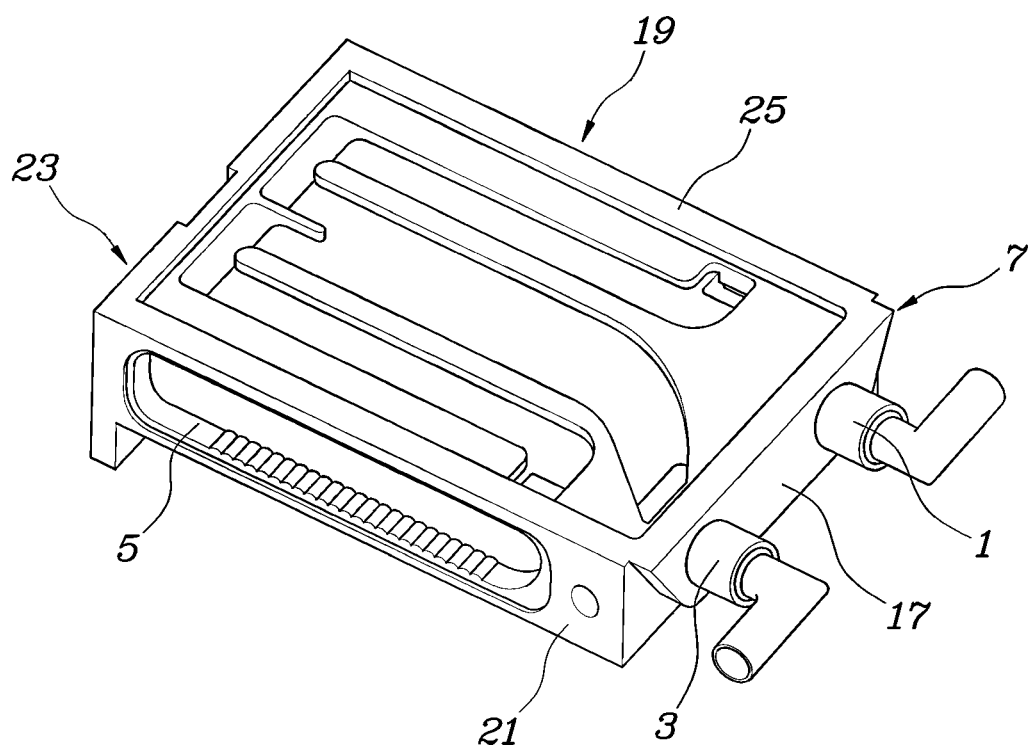
FIG. 4 is a view showing a cooling block of FIG. 3.

For reference, in the present embodiment, for the convenience of processing, the cooling block 7 is configured to enable the refrigerant flow path 51 to be formed, that is, the connection flow path parts 33, the merging part 31, and the discharge flow path part 35 are formed on an upper side of the cooling block 7 as shown in FIG. 4, and a cover plate 49 is mounted on an upper side thereof as shown in FIG. 1, whereby the top surface 25 of the cooling block 7 is sealed.

In addition, a control board electrically connected to the power module 37 may be positioned on the top surface 25 of the cooling block 7.

While the present disclosure has been shown and described with reference to specific embodiments, it will be apparent to those of ordinary skill in the art that the present disclosure can be variously improved and changed without departing from the spirit of the present disclosure provided by the following claims.

What is claimed is:

1. A power converter apparatus for a vehicle, the power converter apparatus comprising:
    a cooling block provided with a refrigerant inlet and a refrigerant outlet, and with two cooling baths connected to the refrigerant inlet in parallel and each having a shape open to an outside, the cooling block being configured to allow refrigerants passing through the two cooling baths to be merged prior to being discharged through the refrigerant outlet;
    two cooling plates, wherein each of the two cooling plates covers an opening of an associated one of the cooling baths to provide a cooling chamber and includes a plurality of cooling fins protruding into the cooling chamber; and
    two cooling tubes, wherein each of the two cooling tubes is coupled to the cooling block to provide a space for accommodating a power module between the cooling tube and an associated one of the cooling plates, each of the two cooling tubes being configured to receive the refrigerant from the refrigerant inlet of the cooling block, thereby delivering the refrigerant to the cooling chamber.

2. The power converter apparatus of claim 1, wherein the cooling block comprises:
    a first side surface provided with the refrigerant inlet and the refrigerant outlet;
    a second side surface and a third side surface respectively connected to opposite ends of the first side surface and respectively provided with the cooling baths;
    a fourth side surface having opposite ends respectively connected to the second side surface and the third side surface; and
    a top surface and a bottom surface respectively disposed on a top side and a bottom side of the cooling block to be perpendicular to the first side surface, the second side surface, the third side surface, and the fourth side surface.

3. The power converter apparatus of claim 2, wherein each of the two cooling tubes is connected to the refrigerant inlet at a side close to the first side surface and communicated with the cooling chamber at a side close to the fourth side surface; and
    the cooling chamber is configured such that the refrigerant is to be discharged at a side close to the first side surface, whereby cooling surfaces are formed on opposite sides of the power module between the cooling tube and the cooling plate by the refrigerants flowing in opposite directions to each other.

4. The power converter apparatus of claim 2, wherein the refrigerant flow path of the cooling block comprises:
    a branch flow path part at which the refrigerant flowing into the refrigerant inlet is branched off toward the two cooling tubes;
    a merging part at which the refrigerants discharged from the cooling chambers of the two cooling plates are merged;
    two connection flow path parts connecting the cooling chambers and the merging part to each other; and
    a discharge flow path part connected from the merging part to the refrigerant outlet.

5. The power converter apparatus of claim 4, wherein each of the two cooling chambers is configured such that the refrigerant is discharged at a side close to the first side surface;
    the merging part is provided at a side close to the fourth side; and
    the two connection flow path parts are connected to the cooling chambers, respectively, at sides close to the first side surface with the discharge flow path part interposed therebetween on a same plane and to be connected to the merging part at the side close to the fourth side.

6. The power converter apparatus of claim 5, wherein a mounting bath opened to the outside is disposed on the bottom surface of the cooling block.

7. The power converter apparatus of claim 6, further comprising a capacitor and a high voltage DC-DC converter (HDC) disposed in the mounting bath.

8. The power converter apparatus of claim 5, wherein the two connection flow path parts are provided with respective expansion flow path parts configured to expand a heat exchange area with the fourth side surface at two portions adjacent to the fourth side surface.

9. The power converter apparatus of claim 8, further comprising a low voltage DC-DC converter (LDC) disposed on the fourth side surface.

10. The power converter apparatus of claim 2, further comprising an LDC disposed on the fourth side of the cooling block; and
    a capacitor and an HDC disposed on the bottom surface of the cooling block.

11. The power converter apparatus of claim 5, wherein the two connection flow path parts, the merging part, and the discharge flow path part are exposed on an upper side of the cooling block, and a cover plate configured to seal a side above the two connection flow path parts, the merging part, and the discharge flow path part is mounted on the cooling block, so that the refrigerant flow path is formed.

* * * * *